United States Patent
Kim

(10) Patent No.: US 8,803,215 B2
(45) Date of Patent: Aug. 12, 2014

(54) SEMICONDUCTOR DEVICE AND METHOD OF MANUFACTURING THE SAME

(71) Applicant: SK hynix Inc., Gyeonggi-do (KR)

(72) Inventor: Suk Goo Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/800,310

(22) Filed: Mar. 13, 2013

(65) Prior Publication Data

US 2014/0167129 A1   Jun. 19, 2014

(30) Foreign Application Priority Data

Dec. 13, 2012 (KR) .................. 10-2012-0145244

(51) Int. Cl.
*H01L 29/76* (2006.01)

(52) U.S. Cl.
USPC ........................................... 257/314

(58) Field of Classification Search
CPC .......... H01L 27/11521; H01L 27/11551; H01L 27/11568; H01L 27/11578
USPC ........................................... 257/314
See application file for complete search history.

(56) References Cited

U.S. PATENT DOCUMENTS

| 8,507,918 B2 * | 8/2013 | Son et al. .................. 257/74 |
| 8,617,947 B2 * | 12/2013 | Yang et al. ................ 438/199 |
| 8,633,104 B2 * | 1/2014 | Pyo et al. ................... 438/618 |
| 2009/0310425 A1 * | 12/2009 | Sim et al. ................ 365/185.29 |
| 2013/0032875 A1 * | 2/2013 | Yun et al. .................. 257/324 |
| 2013/0161731 A1 * | 6/2013 | Bin et al. ................... 257/329 |
| 2013/0168757 A1 * | 7/2013 | Hong ......................... 257/324 |
| 2013/0207182 A1 * | 8/2013 | Lee et al. ................... 257/329 |

FOREIGN PATENT DOCUMENTS

KR   1020110094985   8/2011

* cited by examiner

*Primary Examiner* — Bilkis Jahan
(74) *Attorney, Agent, or Firm* — IP & T Group LLP

(57) ABSTRACT

A semiconductor device includes a bit line and a common source line formed on a cell array region of a substrate, a first channel layer coupled to the common source line and extending higher than the common source line, a second channel layer coupled to the bit line and extending higher than the bit line, and a coupling pattern coupling a top of the first channel layer opposite to the common source line and a top of the second channel layer opposite to the bit line.

9 Claims, 8 Drawing Sheets

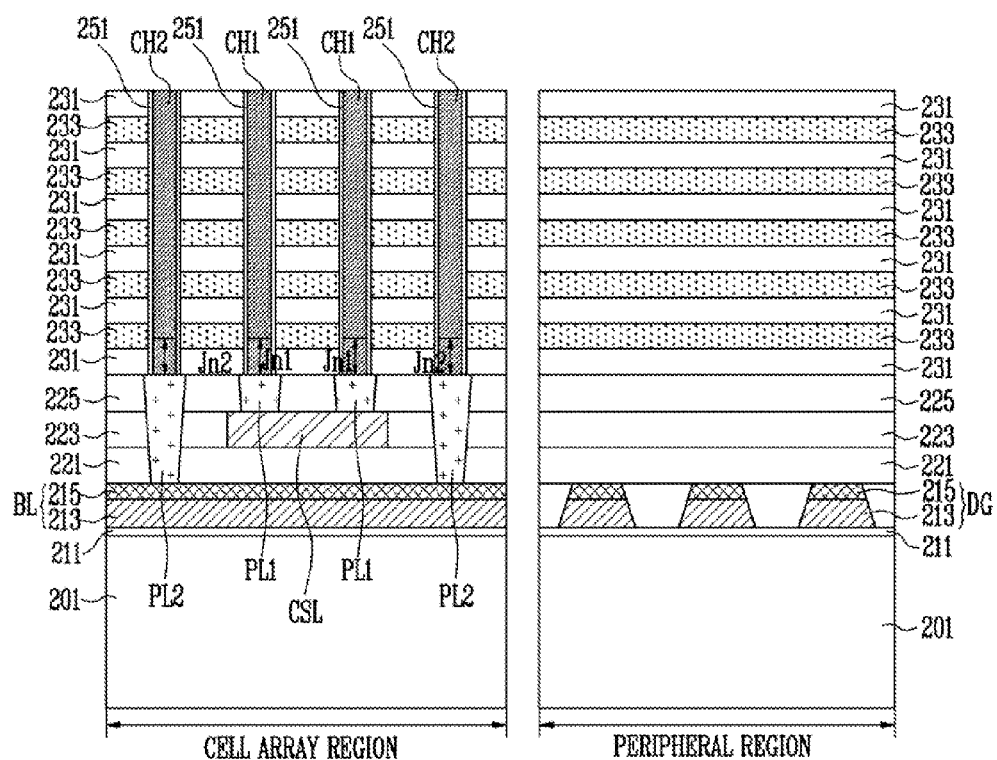

SEMICONDUCTOR DEVICE AND METHOD OF MANUFACTURING THE SAME

CROSS-REFERENCE TO RELATED APPLICATION

The present application claims priority of Korean patent application number 10-2012-0145244, filed on Dec. 13, 2012, the entire disclosure of which is incorporated herein by reference in its entirety.

BACKGROUND

1. Field of Invention

Various embodiments of the present invention relate to a semiconductor device and a method of manufacturing the same and, more particularly, to a three-dimensional semiconductor device and a method of manufacturing the same.

2. Description of Related Art

In two-dimensional (2D) semiconductor devices, memory cells are two-dimensionally arranged over a substrate. A variety of technologies for reducing the size of memory cells are being developed in order to increase a degree of integration of 2D semiconductor devices. However, these technologies have limitations in reducing the size of memory cells.

In three-dimensional (3D) semiconductor devices, memory cells are three-dimensionally arranged over a substrate. Therefore, as compared with 2D semiconductor devices, 3D semiconductor devices may increase their degree of integration. Accordingly, a variety of technologies for the structure of a 3D semiconductor device and a manufacturing method thereof have been proposed.

BRIEF SUMMARY

Various exemplary embodiments of the present invention relate to a three-dimensional semiconductor device and a method of manufacturing the same.

A semiconductor device, according to an exemplary embodiment of the present invention, includes a bit line and a common source line formed on a substrate, a first channel layer coupled to the common source line and extending higher than the common source line, a second channel layer coupled to the bit line and extending higher than the bit line, and a coupling pattern coupling a top of the first channel layer opposite to the common source line and a top of the second channel layer opposite to the bit line.

A method of manufacturing a semiconductor device, according to another exemplary embodiment of the present invention, includes forming a bit line and a common source line on a substrate, alternately stacking first material layers and second material layers on the substrate where the bit line and the common source line are formed, forming a first channel layer and a second channel layer, wherein the first and second channel layers pass through the first and second material layers, and the first and second channel layers are coupled to the common source line and the bit line, respectively, and forming a coupling pattern coupling the first and second channel layers to each other, wherein the coupling pattern is located on top of the first and second channel layers.

BRIEF DESCRIPTION OF THE DRAWINGS

FIGS. 2A to 2G are cross-sectional views illustrating a method of manufacturing a semiconductor device according to an embodiment of the present invention;

DESCRIPTION OF EMBODIMENTS

Figure 1:
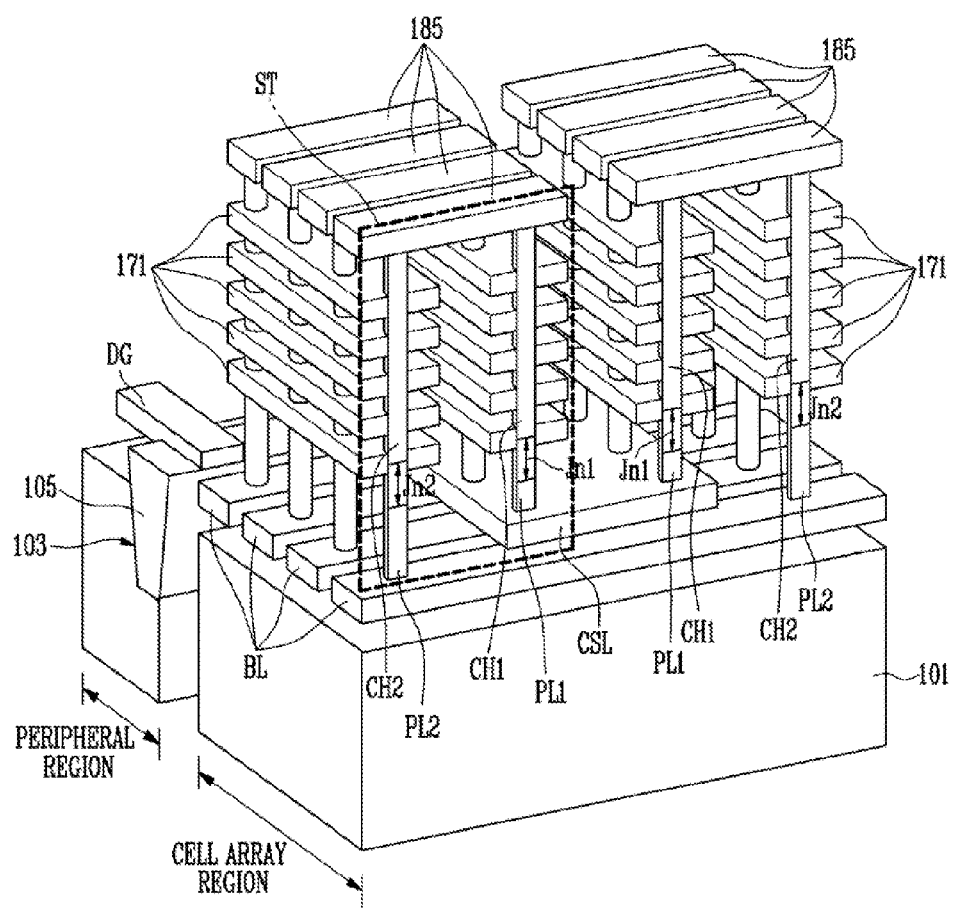
FIG. 1 is a perspective view illustrating a semiconductor device according to an embodiment of the present invention.

Hereinafter, various embodiments of the present invention will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. It should be readily understood that the meaning of "on" and "over" in the present disclosure should be interpreted in the broadest manner such that "on" means not only 'directly on but also "on'" something with an intermediate feature(s) or a layer(s) therebetween, and that "over" means not only directly on top but also on top of something with an intermediate feature(s) or a layer(s) therebetween.

FIG. 1 a perspective view illustrating semiconductor device according to an embodiment of the present invention. In FIG. 1, insulating layers are not depicted for convenience of description.

Referring to FIG. 1, a semiconductor device according to an embodiment of the present invention may include a substrate 101, a plurality of bit lines BL, a common source line CSL, a plurality of cell strings ST, circuit devices and an isolation layer 105. The substrate 101 may include a cell array region and a peripheral region. The bit lines BL may be formed on the cell array region of the substrate 101. The common source line CSL may be separated from the bit lines BL and formed on the cell array region of the substrate 101. The cell strings ST may be coupled to the common source line CSL. The circuit devices may be formed on the peripheral region of the substrate 101. The isolation layer 105 may be formed in a trench 103 of the substrate 101.

The circuit devices may include a capacitor, a register and a driving transistor, all of which form a circuit configured to drive a cell string. In FIG. 1, a single driving transistor is illustrated for illustration purposes. The driving transistor may include driving gates DG that are formed on the substrate 101.

The isolation layer 105 may be formed to insulate devices from each other. The isolation layer 105 may extend higher than the substrate 101. In addition, the isolation layer 105 may be disposed lower than the driving gate DG.

The bit lines BL may be located under the cell strings ST and coupled to the cell strings ST. The bit lines BL may be formed at the same time as the driving gates DG are formed. The bit lines BL may include substantially the same material as that of the driving gates DG and be formed on the same level as that of the driving gates DG. For example, each of the bit line BL and the driving gate DG may have a stacked structure of a polysilicon layer and a metal silicide layer. The metal silicide layer may have a lower resistance than that of the polysilicon layer. Since a metal silicide layer is used to form each of the bit line BL and the driving gate DG, the resistance of each of the bit line BL and the driving gate DG may be reduced.

The common source line CSL may be separated from the bit lines BL and formed on the bit lines BL. The common source line CSL may be located under the cell strings ST and coupled to the cell strings ST. In addition, the cell strings ST coupled to the respective bit lines BL may be coupled in common to the common source line CSL.

Each of the cell strings ST may include a first channel layer CH1, a second channel layer CH2, a coupling pattern 185 and conductive patterns 171. The first channel layer CH1 may extend higher than the common source line CSL. The second channel layer CH2 may extend higher than the bit line BL. The coupling pattern 185 may couple the first and second channel layers CH1 and CH2 to each other. The conductive patterns 171 may intermittently surround each of the first channel layer CH1 and the second channel layer CH2 and may be stacked on top of one another. A first conductive plug PL1 may be further formed between the first channel layer CH1 and the common source line CSL, and a second conductive plug PL2 may be further formed between the second channel layer CH2 and the bit line BL.

The first channel layer CH1 may be coupled to the common source line CSL, and the second channel layer CH2 may be coupled to the bit line BL. Each of the first and second channel layers CH1 and CH2 may include a semiconductor material. For example, each of the first and second channel layers CH1 and CH2 may include an undoped polysilicon layer.

The coupling pattern 185 may be formed on a top of the first channel layer CH1 opposite to the common source line CSL and a top of the second channel layer CH2 opposite to the bit line BL. The coupling pattern 185 may be couple the first and second channel layers CH1 and CH2 to each other. The coupling pattern 185 may include a semiconductor layer or a conductive layer, either of which electrically couples the first and second channel layers CH1 and CH2 to each other. When the coupling pattern 185 includes a semiconductor layer, a gate pattern (not illustrated) may be further formed so that the gate pattern may surround the coupling pattern 185 while interposing a gate insulating layer therebetween. The coupling pattern 185 may be used as a channel layer and form a transistor. In this example, the first and second channel layers CH1 and CH2 may be coupled to each other by controlling an on/off operation of the transistor including the coupling pattern 185 with a voltage applied to the gate pattern of the transistor. When the coupling pattern 185 includes a conductive layer such as a metal layer, the first and second channel layers CH1 and CH2 may be more easily electrically coupled to each other as compared when the first and second channel layers CH1 and CH2 are electrically coupled to each other into a transistor structure as described above.

The conductive patterns 171 may be divided into patterns surrounding the first channel layer CH1 and patterns surrounding the second channel layer CH2. At least one of lowermost conductive patterns, among the conductive patterns surrounding the first channel layer CH1, may be used as a source select line, and the other conductive patterns formed over the lowermost conductive pattern may be used as first word lines. At least one of lowermost conductive patterns, among the conductive patterns surrounding the second channel layer CH2, may be used as a drain select line, and the other conductive patterns formed over the lowermost conductive pattern may be used as second word lines. The conductive patterns 171 may extend in a direction crossing the bit line BL.

Though not illustrated in FIG. 1, data storage layers may be formed between each of the conductive patterns 171 and the first channel layer CH1 and between each of the conductive patterns 171 and the second channel layer CH2. The data storage layer may include a nitride layer that may trap charge. A charge blocking layer may be further formed between the data storage layer and the conductive pattern 171. Tunnel insulating layers may be further formed between the data storage layer and the first channel layer CH1 and between the data storage layer and the second channel layer CH2. The charge blocking layer may include a silicon oxide layer, or a dielectric layer having a dielectric constant higher than that of the silicon oxide layer. An aluminum oxide layer ($Al_2O_3$) or a hafnium oxide layer ($HfO_2$) may be used as a dielectric layer having a higher dielectric constant than that of a silicon oxide layer. The tunnel insulating layer may be used as a silicon oxide layer.

A first memory cell may be formed at an intersection between the first channel layer CH1 and a conductive pattern configured as a first word line. A second memory cell may be formed at an intersection between the second channel layer CH2 and a conductive pattern configured as a second word line. A source select transistor may be formed at an intersection between the first channel layer CH1 and a conductive pattern configured as a source select line. A drain select transistor may be formed at an intersection between the second channel layer CH2 and a conductive pattern configured as a drain select line. A plurality of first memory cells may be stacked along the first channel layer CH1. A plurality of second memory cells may be stacked along the second channel layer CH2. The source select transistor may be located under the first memory cells, and the drain select transistor may be located under the second memory cells.

Each of the first and second conductive plugs PL1 and PL2 may include a doped polysilicon layer. Dopants in the doped polysilicon layer may be diffused into the first and second channel layers CH1 and CH2 adjacent to the first and second conductive plugs PL1 and PL2, respectively, so that first and second junction regions Jn1 and Jn2 including the dopants may be formed in the first and second channel layers CH1 and CH2, respectively. The first junction region Jn1 of the first channel layer CH1 may be used as a source region of the cell string ST, and the second junction region Jn2 of the second channel layer CH2 may be used as a drain region of the cell string ST. The first junction region Jn1 may partially overlap the conductive pattern configured as a source select line, and the second junction region Jn2 may partially overlap the conductive pattern configured as a drain select line.

As described above, in the present invention, since the coupling pattern 185 coupling the first and second channel layers CH1 and CH2 are formed on top of the first and second channel layers CH1 and CH2, the reliability of the 3D semiconductor device may be increased. Unlike the present invention, the coupling pattern 185 may be formed under the first and second channel layers CH1 and CH2. In this example, a pipe gate may be formed to have a trench that defines a region where a coupling pattern is formed, a multilayer film may be formed on the pipe gate, and a U-shaped through hole may be formed to include the trench and channel holes formed through the multilayer film and coupled at both ends of the trench. Subsequently, the U-shaped through hole may be filled with a semiconductor layer to form the coupling pattern 185 and the first and second channel layers CH1 and CH2 at the same time. Here, before the coupling pattern 185 is formed in the trench, the channel holes may be filled with semiconductor layers. In this example, the coupling pattern 185 may not be properly formed since the trench may not be filled with the semiconductor layer. On the other hand, in the present invention, since the coupling pattern 185 is formed on top of the first and second channel layers CH1 and CH2, the coupling pattern 185 may be properly formed even when the channel holes are first filled with a semiconductor layer.

In addition, in the present invention, since the first and second channel layers CH1 and CH2 may be coupled to each other by the coupling pattern 185 including a metal layer, the amount of current flowing through the cell string ST may be increased.

In addition, in the present invention, the first and second junction regions Jn1 and Jn2 may be formed by diffusing dopants into the first and second channel layers CH1 and CH2 from the first and second conductive plugs PL1 and PL2. Since the dopants may be controlled to be diffused to uniform heights, the first and second junction regions Jn1 and Jn2 may be formed at uniform heights. Therefore, in the present invention, since variations in threshold voltages caused when junction regions of a source select transistor and a drain select transistor are formed at non-uniform heights may be reduced, operating stability of the source select transistor and the drain select transistor may be ensured.

FIGS. 2A to 2G are cross-sectional views illustrating a method of manufacturing a semiconductor device according to an embodiment of the present invention.

Figure 2A:
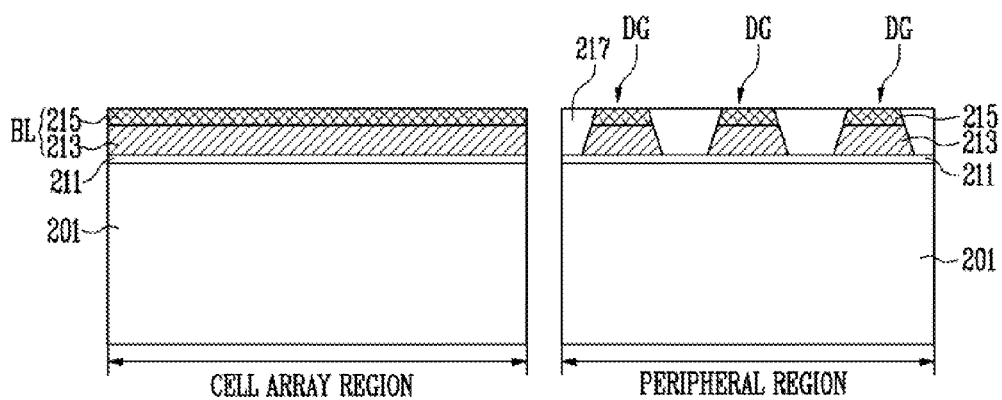

Referring to FIG. 2A, a first interlayer insulating layer 211 and a first conductive layer 213 may be formed on a substrate 201 that includes a cell array region and a peripheral region. Before the first interlayer insulating layer 211 is formed, an isolation layer may be further formed in the substrate 201.

A portion of the first interlayer insulating layer 211 formed on the peripheral region of the substrate 201 may be used as a gate insulating layer. The first conductive layer 213 may include a metal layer, a metal silicide layer or a polysilicon layer.

Subsequently, the first conductive layer 213 may be patterned to form the driving gates DG and the bit lines BL. A portion of the first conductive layer 213 may be changed into a second conductive layer 215 that has a lower resistance than that of the first conductive layer 213. For example, when the first conductive layer 213 includes a polysilicon layer, a portion of the polysilicon layer may be changed into a metal silicide layer by a silicidation process. As a result, the first conductive layer 213 may have a stacked structure of a polysilicon layer and a metal silicide layer, so that the driving gates DG and the bit lines BL both with low resistance may be formed.

Subsequently, a region from which the first conductive layer 213 is etched may be filled with an insulating material 217. The surface of the insulating material 217 may be planarized by further performing chemical mechanical polishing (CMP).

Figure 2B:
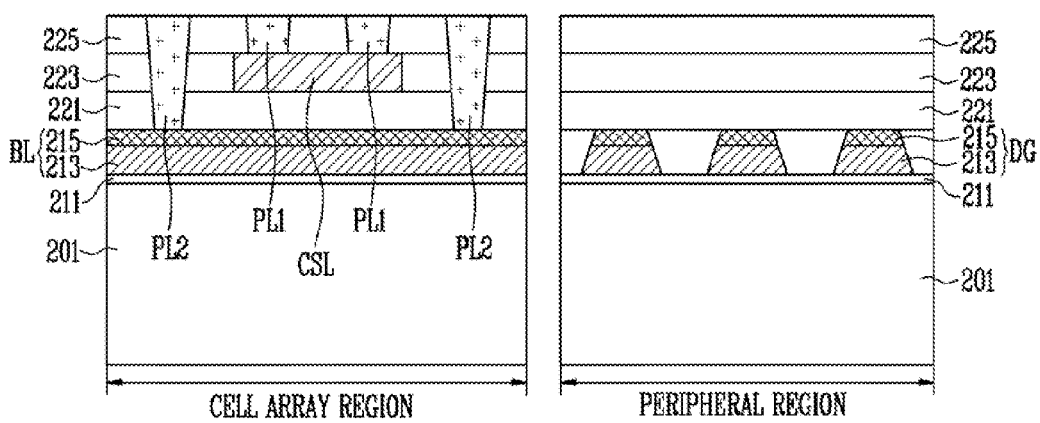

Referring to FIG. 2B, a second interlayer insulating layer 221 may be formed on the substrate 201 so that the second interlayer insulating layer 221 may cover the bit lines BL and the driving gates DG. Subsequently, the common source line CSL may be formed on the second interlayer insulating layer 221. The common source line CSL may be formed by forming a third interlayer insulating layer 223 on the second interlayer insulating layer 221, etching the third interlayer insulating layer 223 to form a common source line trench and filling the common source line trench with a conductive material. Alternately, the common source line CSL may be formed by forming a conductive layer on the second interlayer insulating layer 221 and patterning the conductive layer.

After the common source line CSL is formed, a fourth interlayer insulating layer 225 may be formed on the substrate 201 so that the fourth interlayer insulating layer 225 may cover the common source line CSL. Subsequently, the first conductive plugs PL1 and the second conductive plugs PL2 may be formed. The first conductive plugs PL1 may pass through the fourth interlayer insulating layer 225 and be coupled to the common source line CSL. The second conductive plugs PL2 may pass through the second to fourth interlayer insulating layer 221, 223 and 225 and be coupled to the bit line BL. The first and second conductive plugs PL1 and PL2 may be formed in such a manner that the second, third and fourth interlayer insulating layers 221, 223 and 225 are etched by performing an etch process using a mask defining a region, in which the first and second conductive plugs PL1 and PL2 are formed, as an etch barrier to form contact holes; the contact holes are filled with a conductive material; and the etch barrier is removed.

Each of the first and second conductive plugs PL1 and PL2 may include a doped polysilicon layer.

Figure 2C:
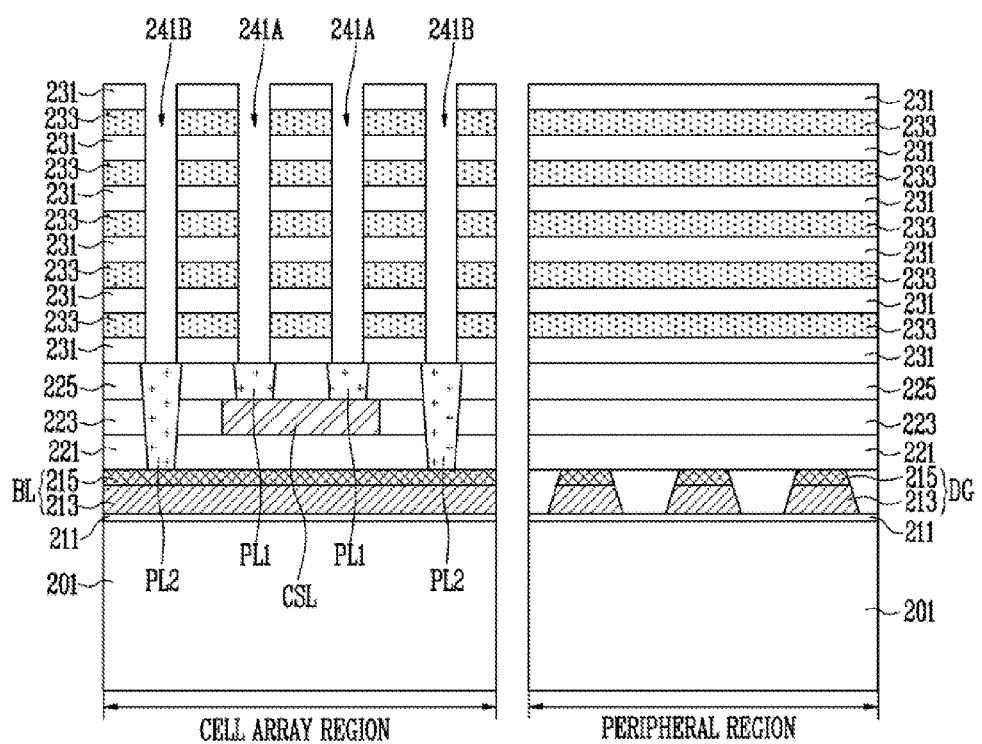

Referring to FIG. 2C, first material layers 231 and second material layers 233 may be stacked alternately with each other on the entire structure including the first and second conductive plugs PL1 and PL2.

The first material layers 231 may be formed in levels where fifth interlayer insulating layers are formed. The second material layers 233 may be formed in levels where word lines and select lines are formed. These select lines may be formed in one or more layers. A layer where a select line is formed and a layer where a word line is formed may have the same or different thicknesses.

The first material layers 231 and the second material layers 233 may include material layers having a high etch selectivity with respect to each other. For example, each of the first material layers 231 may include an oxide layer configured as an interlayer insulating layer. Each of the second material layers 233 may include a conductive layer such as a polysilicon layer, a metal layer or a metal silicide layer. Alternatively, each of the first material layers 231 may include an oxide layer such as an interlayer insulating layer, and each of the second material layers 233 may include a nitride layer configured as a sacrificial layer. Alternatively, the first material layer 231 may include an undoped polysilicon layer configured as a sacrificial layer, and the second material layer 233 may include a doped polysilicon layer to be used as a word line or a select line.

Subsequently, the first material layers 231 and the second material layers 233 may be etched to form first channel holes 241A through which the first conductive plugs PL1 are exposed and second channel holes 241B through which the second conductive plugs PL2 are exposed.

Referring to FIG. 2D, semiconductor layers may be formed in the first and second channel holes 241A and 241B. As a result, the first channel layers CH1 may be formed in the first channel holes 241A so that the first channel layers CH1 may be coupled to the first conductive plugs PL1, and the second channel layers CH2 may be formed in the second channel holes 241B so that the second channel layers CH2 may be coupled to the second conductive plugs PL2. An undoped polysilicon layer may be used as a semiconductor layer. Though not illustrated in FIG. 2D, lower portions of the first and second channel holes 241A and 241B may be filled with lower portions of the first and second channel layers CH1 and CH2, respectively, even when voids are formed in the first and second channel layers CH1 and CH2 since the first and second channel layers CH1 and CH2 are narrow and deep. Therefore, despite voids that may be formed in the first and second channel layers CH1 and CH2, the lower portions of the first and second channel layers CH1 and CH2 that fill the lower portions of the first and second channel holes 241A and 241B, respectively, may reduce contact resistances between the first conductive plug PL1 and the first channel layer CH1, and the second conductive plug PL2 and the second channel layer CH2, respectively.

When each of the first and second conductive plugs PL1 and PL2 includes a doped polysilicon layer, dopants in the first conductive plugs PL1 may be diffused into the first channel layer CH1, and dopants in the second conductive plugs PL2 may be diffused into the second channel layer CH2, by performing a thermal process. As a result, first junction regions Jn1 may be formed in the first channel layers CH1 so that each of the first junction regions Jn1 may be formed at a predetermined height from a contact surface to each of the first conductive plugs PL1. Second junction regions Jn2 may be formed in the second channel layer CH2 so that each of the second junction regions Jn2 may be formed at a predetermined height from a contact surface to each of the second conductive plugs PL2. The first and second junction regions Jn1 and Jn2 may be formed by heat generated during subsequent processes without performing a separate thermal process.

Before a semiconductor layer is formed, at least one third material layer 251 may be formed along a side wall of each of the first and second channel holes 241A and 241B. The third material layer 251 may include at least one of a charge blocking layer, a data storage layer and a tunnel insulating layer.

Figure 2E:
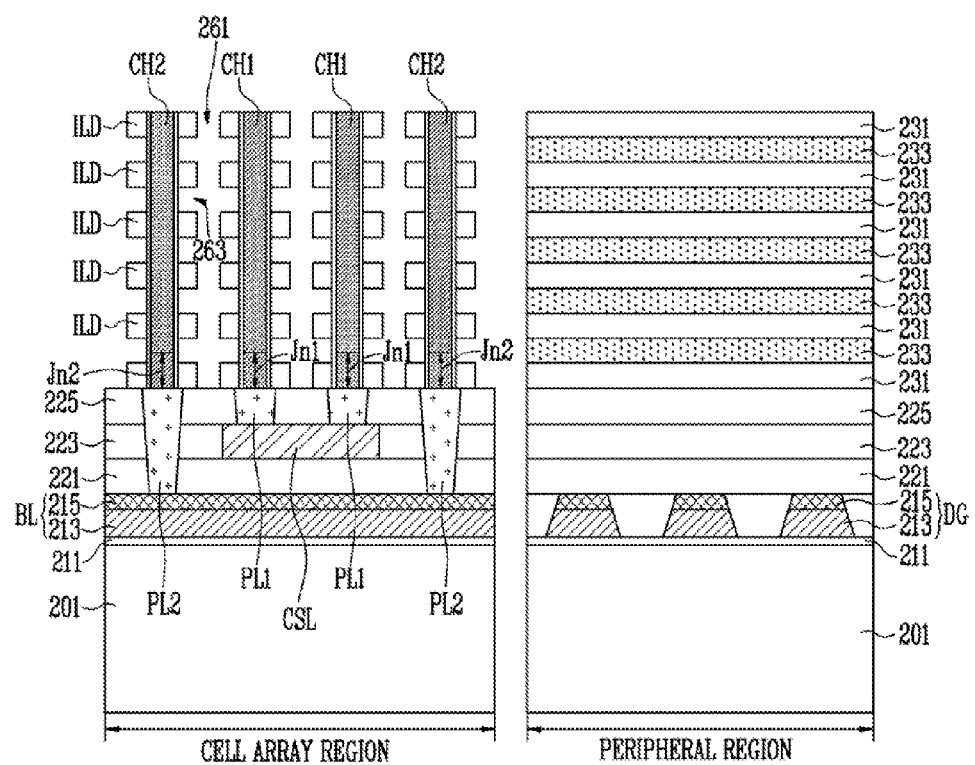

Referring to FIG. 2E, the first material layers 231 and the second material layers 233 may be etched to form slits 261 through the first material layers 231 and the second material layers 233. In FIG. 2E, it is illustrated that the slits 261 are formed on the cell array region. However, the slits 261 may be formed on the peripheral region as well as on the cell array region.

The slit 261 that is formed on the cell array region may be located between the first channel layer CH1 and the second channel layer CH2. In this example, the first material layers 231 and the second material layers 233 may be divided into patterns surrounding the first channel layer CH1 and patterns surrounding the second channel layer CH2 by the slit 261. Side surfaces of the first material layers 231 and side surfaces of the second material layers 233 may be exposed by the slit 261.

Subsequent processes may vary according to compositions of the first material layers 231 and the second material layers 233.

When each of the first material layers 231 includes an oxide layer configured as an interlayer insulating layer, and each of the second material layers 233 includes a nitride layer configured as a sacrificial layer, the second material layers 233 exposed through the slits 261 may be removed by a selective etch process using an etch selectivity as illustrated in FIG. 2E. As a result, recessed regions 263 may be formed in regions from which the second material layers 233 are removed. In addition, fifth interlayer insulating patterns ILD that include the first material layers 231 may be defined by the slits 261.

Figure 2F:
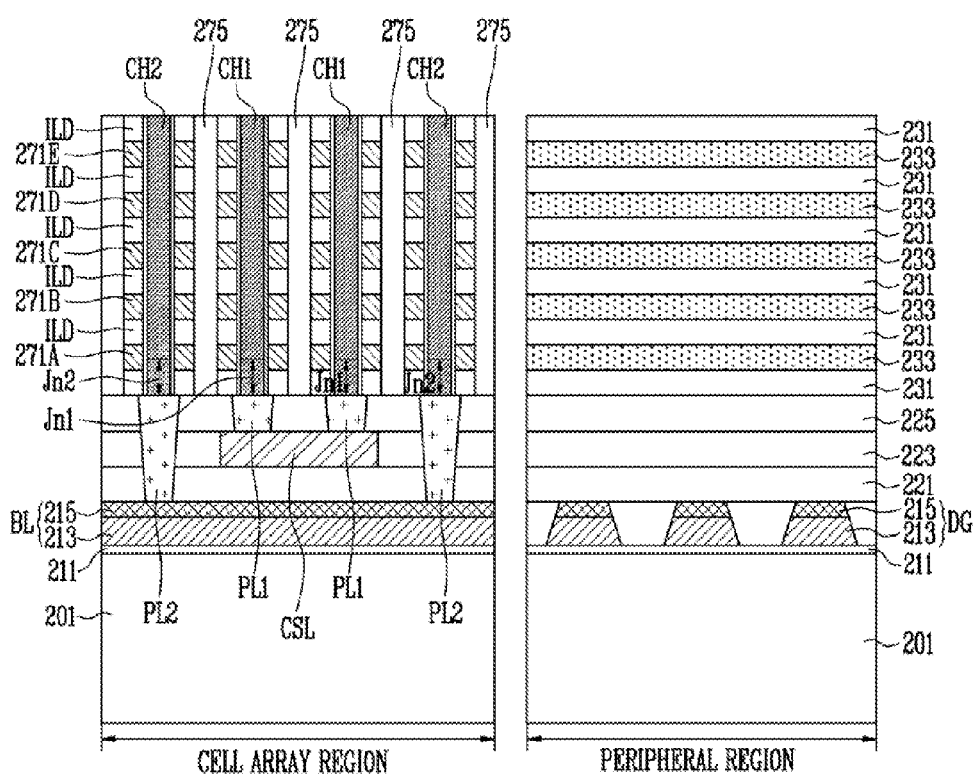

Referring to FIG. 2F, the recessed regions 263 may be filled with conductive materials to form conductive patterns 271A to 271E configured as word lines and select lines. Here, at least one of lowermost conductive patterns, among the conductive patterns 271A to 271E stacked on top of one another and surrounding the first channel layer CH1, for example, the conductive pattern 271A may be used as a source select line. The other conductive patterns 271B to 271E formed over the conductive pattern 271A may be used as word lines of first memory cells. In addition, at least one of lowermost conductive patterns, among the conductive patterns 271A to 271E stacked on top of one another and surrounding the second channel layer CH2, for example, the conductive pattern 271A may be used as a drain select line. The other conductive patterns 271B to 271E formed over the conductive patterns 271A may be used as word lines of second memory cells.

Before the recessed regions 263 are filled with conductive materials, at least any one of a charge blocking layer, a data storage layer and a tunnel insulating layer may be formed on an inner surface of each of the recessed regions 263. In particular, at least one of the charge blocking layer, the data storage layer and the tunnel insulating layer, which are not formed on the side wall of each of the first and second channel holes 241A and 241B, may be formed on the inner surface of each of the recessed regions 263.

Though not illustrated in FIG. 2F, unlike what is stated above, when each of the first material layers 231 includes an oxide layer configured as an interlayer insulating layer, and each of the second material layers 233 includes a conductive layer, the conductive patterns 271A to 271E including the second material layers 233 and the fifth interlayer insulating patterns ILD including the first material layers 231 may be defined by the slits 261.

Alternatively, when each of the first material layers 231 includes an undoped polysilicon layer configured as a sacrificial layer, and each of the second material layers 233 includes a doped polysilicon layer, the conductive patterns 271A to 271E including the second material layers 233 may be defined by the slits 261. Subsequently, the first material layers 231 exposed through the slits 261 may be removed by a selective etch process using an etch selectivity. As a result, recessed regions may be formed in regions from which the first material layers 231 are removed. Subsequently, the recessed regions may be filled with insulating materials configured as interlayer insulating layers to form the fifth interlayer insulating patterns ILD.

As described above, after the conductive patterns 271A to 271E and the fifth interlayer insulating patterns ILD are formed through various processes, the slits 261 may be filled with gap-fill insulating layers 275.

The first material layers 231 and the second material layers 233 on the peripheral region may remain stacked on the driving gates DG. On the other hand, when slits are further formed on the peripheral region, interlayer insulating patterns and conductive patterns that are defined by the slits may also be stacked on the driving gates DG on the peripheral region. The interlayer insulating patterns and the conductive patterns on the peripheral region may be formed by substantially the same processes as those of forming the fifth interlayer insulating patterns ILD and the conductive patterns 271A to 271E on the cell array region.

Figure 2G:
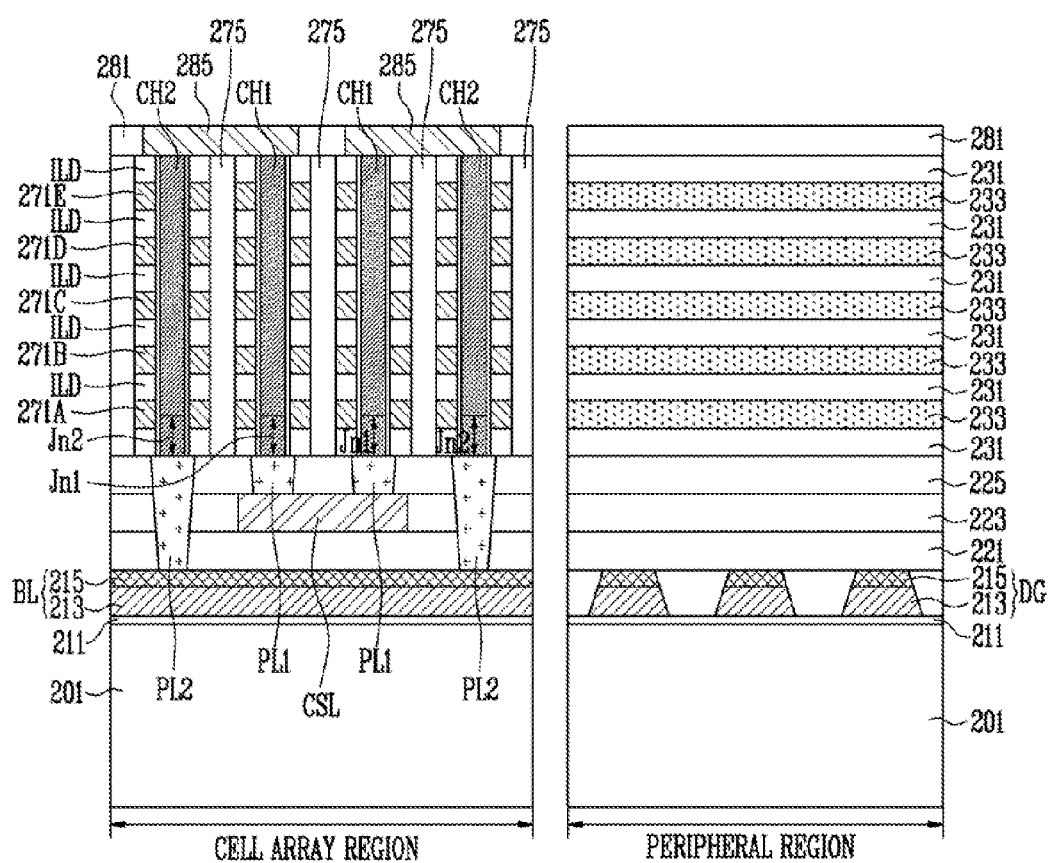

Referring to FIG. 2G, coupling patterns 285 may be formed on the entire structure including the fifth interlayer insulating patterns ILD and the conductive patterns 271A to 271E stacked alternately with each other so that each of the coupling patterns 285 may couple the first and second channel layers CH1 and CH2 to each other. The coupling pattern 285 may be formed by forming a sixth interlayer insulating layer 281, etching the sixth interlayer insulating layer 281 to form a trench and filling the trench with a conductive material. Alternatively, the coupling pattern 285 may be formed by forming a conductive layer and patterning the conductive layer. In addition, the coupling patterns 285 may include a metal layer. Each of the coupling patterns 285 may couple each pair of the first and second channel layers CH1 and CH2.

Figure 3:
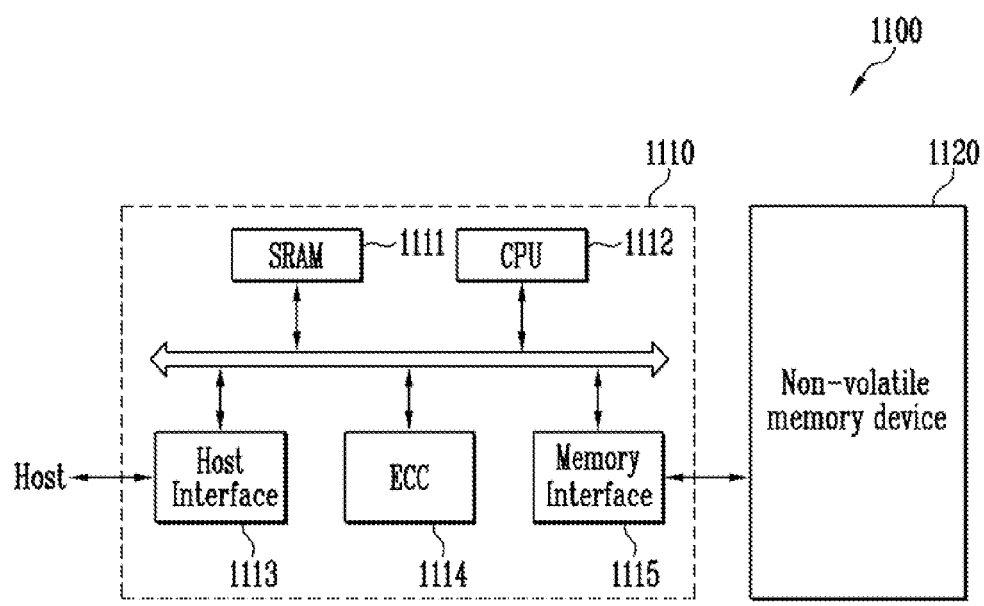
FIG. 3 is a block diagram illustrating a memory system according to an embodiment of the present invention.

FIG. 3 is a view illustrating the configuration of a memory system according to an embodiment of the present invention.

As illustrated in FIG. 3, a memory system 1100 according to an embodiment of the present invention may include a non-volatile memory device 1120 and a memory controller 1110.

The non-volatile memory device 1120 may include the semiconductor device described with reference to the above-described embodiments in connection with FIGS. 1 to 2G. In addition, the non-volatile memory device 1120 may be a multi-chip package composed of a plurality of flash memory chips.

The memory controller 1110 may be configured to control the non-volatile memory device 1120. The memory controller 1110 may include an SRAM 1111, a CPU 1112, a host interface 1113, an ECC 1114 and a memory interface 1115. The SRAM 1111 may function as an operation memory of the CPU 1112. The CPU 1112 may perform a general control operation for data exchange of the memory controller 1110. The host interface 1113 may include a data exchange protocol of a host being coupled to the memory system 1100. In addition, the ECC 1114 may detect and correct errors included in a data read from the non-volatile memory device 1120. The memory interface 1115 may interface with the non-volatile memory device 1120. The memory controller 1110 may further include a ROM that stores code data to interface with the host.

The memory system 1100 having the above-described configuration may be a solid state disk (SSD) or a memory card in which the memory device 1120 and the memory controller 1110 are combined. For example, when the memory system 1100 is an SSD, the memory controller 1110 may communicate with the outside (e.g., a host) through one of the interface protocols including USB, MMC, PCI-E, SATA, PATA, SCSI, ESDI and IDE.

Figure 4:
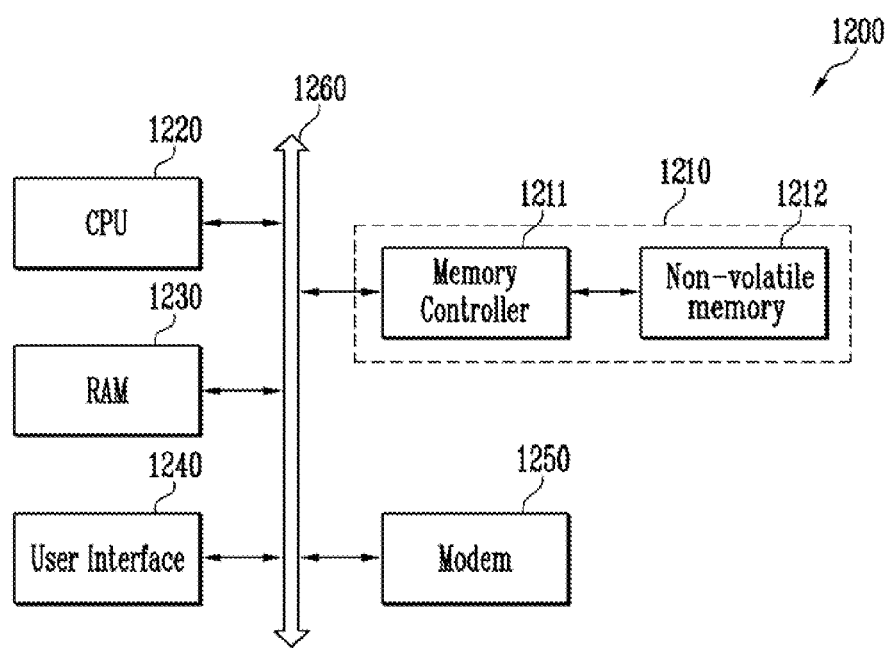
FIG. 4 is a block diagram illustrating a computing system according to an embodiment of the present invention.

FIG. 4 is a view illustrating the configuration of a computing system according to an embodiment of the present invention.

As illustrated in FIG. 4, a computing system 1200 according to an embodiment of the present invention may include a CPU 1220, a RAM 1230, a user interface 1240, a modem 1250 and a memory system 1210, all of which are electrically coupled to a system bus 1260. In addition, when the computing system 1200 is a mobile device, a battery may be further included to apply an operating voltage to the computing system 1200. The computing system 1200 may further include application chipsets, a Camera Image Processor (CIS) and a mobile DRAM.

As described above with reference to FIG. 3, the memory system 1210 may include a non-volatile memory 1212 and a memory controller 1211.

According to an embodiment of the present invention, since a cell string may include memory cells stacked along first and second channel layers and a coupling pattern coupling the first and second channel layers, the memory cells of the cell string may be three-dimensionally arranged on a substrate. Accordingly, a degree of integration of a semiconductor device may be increased.

What is claimed is:

1. A semiconductor device, comprising:
   a bit line and a common source line formed on a substrate;
   a first channel layer coupled to the common source line and extending higher than the common source line;
   a second channel layer coupled to the bit line and extending higher than the bit line; and
   a coupling pattern coupling a top of the first channel layer opposite to the common source line and a top of the second channel layer opposite to the bit line.

2. The semiconductor device of claim 1, wherein the coupling pattern includes a metal layer.

3. The semiconductor device of claim 1, further comprising a driving gate formed on the substrate and located in substantially the same layer as that of the bit line.

4. The semiconductor device of claim 3, wherein each of the driving gate and the bit line has a stacked structure of a polysilicon layer and a metal silicide layer formed on the polysilicon layer.

5. The semiconductor device of claim 1, further comprising:
   a first conductive plug formed between the first channel layer and the common source line; and
   a second conductive plug formed between the second channel layer and the bit line.

6. The semiconductor device of claim 5, wherein each of the first and second conductive plugs includes a doped polysilicon layer.

7. The semiconductor device of claim 6, further comprising:
   a first junction region formed in the first channel layer adjacent to the first conductive plug, wherein the first junction region includes a dopant diffused from the first conductive plug; and
   a second junction region formed in the second channel layer adjacent to the second conductive plug, wherein the second junction region includes a dopant diffused from the second conductive plug.

8. The semiconductor device of claim 7, further comprising:
   a source select line located under the coupling pattern, wherein the source select line surrounds the first channel layer and includes a region overlapping the first junction region; and
   a drain select line located under the coupling pattern, wherein the drain select surrounds the second channel layer and includes a region overlapping the second junction region.

9. The semiconductor device of claim 7, wherein the first junction region and the second junction region are formed at uniform heights.

* * * * *